United States Patent
Hashimoto et al.

(10) Patent No.: US 11,339,242 B2
(45) Date of Patent: May 24, 2022

(54) METHOD FOR MANUFACTURING SEMICONDUCTOR SUBSTRATE HAVING GROUP-III NITRIDE COMPOUND LAYER

(71) Applicants: NISSAN CHEMICAL CORPORATION, Tokyo (JP); NAGOYA UNIVERSITY, Nagoya (JP)

(72) Inventors: Keisuke Hashimoto, Toyama (JP); Yasunobu Someya, Toyama (JP); Masaru Hori, Nagoya (JP); Makoto Sekine, Nagoya (JP)

(73) Assignees: NISSAN CHEMICAL CORPORATION, Tokyo (JP); NAGOYA UNIVERSITY, Nagoya (JP)

( * ) Notice: Subject to any disclaimer, the term of this patent is extended or adjusted under 35 U.S.C. 154(b) by 97 days.

(21) Appl. No.: 16/083,842

(22) PCT Filed: Mar. 7, 2017

(86) PCT No.: PCT/JP2017/009061
§ 371 (c)(1),
(2) Date: Nov. 27, 2018

(87) PCT Pub. No.: WO2017/154924
PCT Pub. Date: Sep. 14, 2017

(65) Prior Publication Data
US 2019/0225731 A1 Jul. 25, 2019

(30) Foreign Application Priority Data
Mar. 8, 2016 (JP) .................................. 2016-044904

(51) Int. Cl.
| | | |
|---|---|---|
| *C08G 12/08* | (2006.01) | |
| *C08G 65/40* | (2006.01) | |
| *G03F 7/11* | (2006.01) | |
| *G03F 7/40* | (2006.01) | |
| *H01L 21/3065* | (2006.01) | |
| *H01L 21/027* | (2006.01) | |
| *G03F 7/09* | (2006.01) | |

(52) U.S. Cl.
CPC ............. *C08G 12/08* (2013.01); *C08G 65/40* (2013.01); *G03F 7/094* (2013.01); *G03F 7/11* (2013.01); *G03F 7/40* (2013.01); *H01L 21/027* (2013.01); *H01L 21/0271* (2013.01); *H01L 21/3065* (2013.01)

(58) Field of Classification Search
CPC .... C08G 12/08; C08G 65/40; C08G 65/4012; C09D 161/22; G03F 7/094; G03F 7/11; G03F 7/40; H01L 21/027; H01L 21/0271; H01L 21/30621; H01L 21/3065; H01L 21/3081
See application file for complete search history.

(56) References Cited

U.S. PATENT DOCUMENTS

| | | | |
|---|---|---|---|
| 9,263,286 B2* | 2/2016 | Sakamoto | ............ C09D 161/22 |
| 9,746,772 B2* | 8/2017 | Okuyama | ................. G03F 7/32 |
| 2003/0146485 A1* | 8/2003 | Ezaki | ......................... G03F 1/72 |
| | | | 257/499 |

(Continued)

FOREIGN PATENT DOCUMENTS

| | | |
|---|---|---|
| JP | 2007-311801 A | 11/2007 |
| JP | 2014-024831 A | 2/2014 |

(Continued)

OTHER PUBLICATIONS

Kudo et al "Development of Spin-On-Carbon Hard Mask for Advanced Node", 2014 (Year: 2014).*
Jun. 13, 2017 International Search Report issued in International Patent Application No. PCT/JP2017/009061.
Jun. 13, 2017 Written Opinion of the International Searching Authority issued in International Patent Application No. PCT/JP2017/009061.

(Continued)

*Primary Examiner* — Ling Siu Choi
*Assistant Examiner* — Gennadiy Mesh
(74) *Attorney, Agent, or Firm* — Oliff PLC

(57) ABSTRACT

A method for manufacturing a semiconductor substrate having a patterned group-III nitride compound layer without collapsing a formed mask pattern due to reflow or decomposition even when an etching method at a high temperature of 300° C.-700° C. is used, including the steps: forming a patterned mask layer on the substrate's group-III nitride compound layer, and etching the group-III nitride compound layer by dry etching at 300° C. or higher and 700° C. or lower using the mask pattern, to form patterned group-III nitride compound layer, wherein the patterned mask layer contains a polymer containing a unit structure of the following Formula (1):

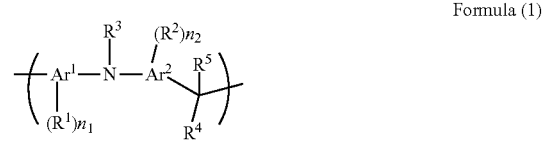

Formula (1)

a polymer containing a unit structure of the following Formula (2):

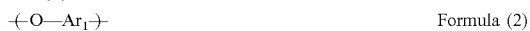

Formula (2)

a polymer containing a structural unit of the following Formula (3):

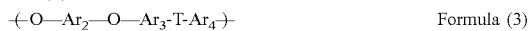

Formula (3)

a polymer containing a combination of unit structure of Formula (2) and unit structure of Formula (3), or a crosslinked structure of the polymers.

7 Claims, 3 Drawing Sheets

(56) References Cited

U.S. PATENT DOCUMENTS

| | | | | |
|---|---|---|---|---|
| 2011/0195362 | A1* | 8/2011 | Watanabe | C07C 69/753 430/323 |
| 2013/0189533 | A1* | 7/2013 | Okuyama | C08L 71/00 428/524 |
| 2014/0106570 | A1* | 4/2014 | Someya | H01L 21/3081 438/703 |
| 2014/0151733 | A1* | 6/2014 | Koike | H01L 33/005 257/98 |
| 2014/0235059 | A1* | 8/2014 | Sakamoto | C08L 79/04 438/702 |
| 2016/0320704 | A1* | 11/2016 | Okuyama | C08G 65/4012 |

FOREIGN PATENT DOCUMENTS

| | | | |
|---|---|---|---|
| JP | 2014-045049 | * | 3/2014 |
| JP | 2014-045049 | A | 3/2014 |
| KR | 10-2013-0129915 | A | 11/2013 |
| KR | 10-2014-0069163 | A | 6/2014 |
| TW | 201333057 | A | 8/2013 |
| WO | 2009/104552 | A1 | 8/2009 |
| WO | 2010/041626 | A1 | 4/2010 |
| WO | 2011/102470 | A1 | 8/2011 |
| WO | 2012/050064 | A1 | 4/2012 |
| WO | 2013/047516 | A1 | 4/2013 |

OTHER PUBLICATIONS

Aug. 6, 2020 Office Action issued in Taiwanese Patent Application No. 106107600.
Jan. 29, 2021 Office Action issued in Taiwanese Patent Application No. 106107600.
May 19, 2021 Office Action issued in Japanese Patent Application No. 2018-504524.
May 20, 2021 Office Action issued in Korean Patent Application No. 10-2018-7028196.

* cited by examiner

METHOD FOR MANUFACTURING SEMICONDUCTOR SUBSTRATE HAVING GROUP-III NITRIDE COMPOUND LAYER

TECHNICAL FIELD

The present invention relates to a method for manufacturing a semiconductor substrate having a patterned group-III nitride compound layer. The present invention also relates to a substrate having a patterned mask layer on a group-III nitride compound layer, a method for manufacturing a compound semiconductor device having a group-III nitride compound layer, and a method for forming a pattern of a semiconductor substrate having a group-III nitride compound layer.

BACKGROUND ART

A group-III nitride compound semiconductor has been known to have higher electron conductivity and higher dielectric breakdown field strength than those of Si. Therefore, the group-III nitride compound semiconductor is expected to be applied to a power device. A conventional GaN-based HEMT has normally-on characteristics in which the HEMT is in an on state even when a voltage is not applied to a gate electrode. That is, although a voltage is not applied to a gate electrode, current flows from a source to a drain. In this case, there is a problem in terms of safety during blackout.

A technique for achieving normally-off in which current does not flow from a source to a drain has been developed. For example, application of a recess structure is useful. For formation of the recess structure, etching a semiconductor layer is required. However, the group-III nitride compound semiconductor is insoluble to a chemical liquid, and therefore, dry etching is used. For example, a technique for etching GaN, InN, and AlN at a substrate temperature of 170° C. or lower by an electron cyclotron resonance (ECR) etching device is used. As an etching gas, a mixed gas of $Cl_2$, $H_2$, and Ar is used. However, when GaN is dry etched with a gas containing $Cl_2$, there is a problem such as deterioration of quality of GaN semiconductor that is caused by change of surface composition and crystal defects.

In order to solve the problem, a technique for dry etching with a gas containing $Cl_2$ with the temperature of a substrate maintained to a high temperature of 200° C. to 600° C. has been proposed as described in Patent Document 1. Patent Document 1 describes that a pattern such as a recess structure can be made by this etching method without deteriorating the quality of GaN semiconductor.

PRIOR ART DOCUMENTS

Patent Documents

Patent Document 1: Japanese Patent Application Publication No. 2014-045049 (JP 2014-045049 A)

SUMMARY OF THE INVENTION

Problem to be Solved by the Invention

For etching a recess pattern or the like, a mask pattern that is an original of the recess pattern is required. The mask pattern is usually formed on a resist film by lithography. Since a resist material does not have high heat resistance, the formed mask pattern is collapsed due to reflow or decomposition when the etching method at a high temperature of 200° C. to 600° C. is used as disclosed in Patent Document 1.

Therefore, an object of the present invention is to solve the aforementioned problem, that is, to provide a method for manufacturing a semiconductor substrate having a patterned group-III nitride compound layer without collapsing a formed mask pattern due to reflow or decomposition even when an etching method at a high temperature of 300° C. to 700° C. is used.

Means for Solving the Problems

The present inventors have intensively investigated to achieve the object, and as a result, found that when a patterned mask layer that is formed on a group-III nitride compound layer of a substrate contains a polymer having a specific structure or a crosslinked structure of the polymer, a semiconductor substrate having a patterned group-III nitride compound layer can be manufactured without collapsing a formed mask pattern due to reflow and decomposition during etching the group-III nitride compound layer by dry etching at 300° C. or higher and 700° C. or lower using the mask pattern. Thus, the present invention has been completed.

Specifically, a first aspect of the present invention relates to a method for manufacturing a semiconductor substrate having a patterned group-III nitride compound layer characterized by comprising steps of: forming a patterned mask layer on a group-III nitride compound layer of the substrate, and etching the group-III nitride compound layer by dry etching at 300° C. or higher and 700° C. or lower using the mask pattern, to form a patterned group-III nitride compound layer, wherein the patterned mask layer contains a polymer containing a unit structure of the following Formula (1):

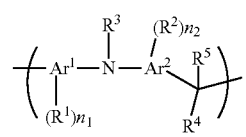

Formula (1)

(wherein $Ar^1$ and $Ar^2$ are each a benzene ring or a naphthalene ring, $R^1$ and $R^2$ are each a substituent of a hydrogen atom on the benzene ring or naphthalene ring and are each selected from the group consisting of a halogen group, a nitro group, an amino group, a hydroxy group, a $C_{1-10}$ alkyl group, a $C_{2-10}$ alkenyl group, a $C_{6-40}$ aryl group, and a combination thereof, the alkyl group, the alkenyl group, and the aryl group are an organic group optionally including an ether bond, a ketone bond, or an ester bond, $R^3$ is selected from the group consisting of a hydrogen atom, a $C_{1-10}$ alkyl group, a $C_{2-10}$ alkenyl group, a $C_{6-40}$ aryl group, and a combination thereof, the alkyl group, the alkenyl group, and the aryl group are an organic group optionally including an ether bond, a ketone bond, or an ester bond, $R^4$ is selected from the group consisting of a $C_{6-40}$ aryl group and a heterocyclic group, the aryl group and the heterocyclic group are an organic group optionally substituted with a halogen group, a nitro group, an amino group, a $C_{1-10}$ alkyl group, a $C_{1-10}$ alkoxy group, a $C_{6-40}$ aryl group, a formyl group, a carboxyl group, or a hydroxy group, $R^5$ is selected from the group consisting of a hydrogen atom, a $C_{1-10}$ alkyl group, a $C_{6-40}$ aryl group, and a heterocyclic group, the alkyl group, the aryl group, and the heterocyclic group are an organic group optionally substituted with a halogen group, a nitro group, an amino group, or a hydroxy group, $R^4$ and $R^5$ optionally form a ring together with a carbon atom to which $R^4$ and $R^5$ are bonded, and $n_1$ and $n_2$ are each an integer of 0 to 3), a polymer containing a unit structure of the following Formula (2):

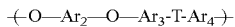  Formula (2)

(wherein $Ar_1$ is an organic group containing a $C_{6-50}$ arylene group or a heterocyclic group), a polymer containing a structural unit of the following Formula (3):

—(O—Ar₂—O—Ar₃-T-Ar₄)—  Formula (3)

(wherein $Ar_2$, $Ar_3$, and $Ar_4$ are each an organic group containing a $C_{6-50}$ arylene group or a heterocyclic group, and T is a carbonyl group or a sulfonyl group), a polymer containing a combination of the unit structure of Formula (2) and the unit structure of Formula (3), or a crosslinked structure of the polymers.

A second aspect of the present invention relates to the method according to the first aspect, wherein the patterned mask layer is formed by steps of forming the mask layer on the group-III nitride compound layer, forming an organic film on the mask layer, forming an organic pattern from the organic film by lithography, and patterning the mask layer through the organic pattern.

A third aspect of the present invention relates to the method according to the second aspect, wherein the patterned mask layer is formed by steps of forming the mask layer on the group-III nitride compound layer, forming a resist film on the mask layer, irradiating the resist film with light or an electron beam followed by development, to form a resist pattern, and patterning the mask layer through the resist pattern.

A fourth aspect of the present invention relates to the method according to the first aspect, wherein the patterned mask layer is formed by steps of forming the mask layer on the group-III nitride compound layer, forming a hard mask on the mask layer, forming an organic film on the hard mask, forming an organic pattern from the organic film by lithography, patterning the hard mask through the organic pattern, and patterning the mask layer through the patterned hard mask.

A fifth aspect of the present invention relates to the method according to any one of the first to fourth aspects, wherein the mask layer is formed from a mask-forming composition by a spin coating method.

A sixth aspect of the present invention relates to the method according to the fifth aspect, wherein the mask-forming composition contains a crosslinker.

A seventh aspect of the present invention relates to the method according to the fifth or sixth aspect, wherein the mask-forming composition contains an acid and/or an acid generator.

An eighth aspect of the present invention relates to a substrate comprising the patterned mask layer according to any one of the first to seventh aspects on the group-III nitride compound layer.

A ninth aspect of the present invention relates to a method for manufacturing a compound semiconductor device having a group-III nitride compound layer comprising a step of processing a semiconductor substrate obtained by the method according to any one of the first to seventh aspects.

A tenth aspect of the present invention is a method for forming a pattern of a semiconductor substrate having a group-III nitride compound layer characterized by comprising steps of:

forming a patterned mask layer on a group-III nitride compound layer of the substrate, and etching the group-III nitride compound layer by dry etching at 300° C. or higher and 700° C. or lower using the mask pattern, to form a patterned group-III nitride compound layer, wherein the patterned mask layer contains a polymer containing a unit structure of the following Formula (1):

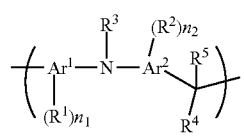  Formula (1)

(wherein $Ar^1$ and $Ar^2$ are each a benzene ring or a naphthalene ring, $R^1$ and $R^2$ are each a substituent of a hydrogen atom on the benzene ring or naphthalene ring and are each selected from the group consisting of a halogen group, a nitro group, an amino group, a hydroxy group, a $C_{1-10}$ alkyl group, a $C_{2-10}$ alkenyl group, a $C_{6-40}$ aryl group, and a combination thereof, the alkyl group, the alkenyl group, and the aryl group are an organic group optionally including an ether bond, a ketone bond, or an ester bond, $R^3$ is selected from the group consisting of a hydrogen atom, a $C_{1-10}$ alkyl group, a $C_{2-10}$ alkenyl group, a $C_{6-40}$ aryl group, and a combination thereof, the alkyl group, the alkenyl group, and the aryl group are an organic group optionally including an ether bond, a ketone bond, or an ester bond, $R^4$ is selected from the group consisting of a $C_{6-40}$ aryl group and a heterocyclic group, the aryl group and the heterocyclic group are an organic group optionally substituted with a halogen group, a nitro group, an amino group, a $C_{1-10}$ alkyl group, a $C_{1-10}$ alkoxy group, a $C_{6-40}$ aryl group, a formyl group, a carboxyl group, or a hydroxy group, $R^5$ is selected from the group consisting of a hydrogen atom, a $C_{1-10}$ alkyl group, a $C_{6-40}$ aryl group, and a heterocyclic group, the alkyl group, the aryl group, and the heterocyclic group are an organic group optionally substituted with a halogen group, a nitro group, an amino group, or a hydroxy group, $R^4$ and $R^5$ optionally form a ring together with a carbon atom to which $R^4$ and $R^5$ are bonded, and $n_1$ and $n_2$ are each an integer of 0 to 3), a polymer containing a unit structure of the following Formula (2):

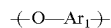  Formula (2)

(wherein $Ar_1$ is an organic group containing a $C_{6-50}$ arylene group or a heterocyclic group), a polymer containing a structural unit of the following Formula (3):

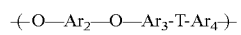  Formula (3)

(wherein $Ar_2$, $Ar_3$, and $Ar_4$ are each an organic group containing a $C_{6-50}$ arylene group or a heterocyclic group, and T is a carbonyl group or a sulfonyl group), a polymer containing a combination of the unit structure of Formula (2) and the unit structure of Formula (3), or a crosslinked structure of the polymers.

Effects of the Invention

The present invention can provide a method for manufacturing a semiconductor substrate having a patterned group-III nitride compound layer without collapsing a formed mask pattern due to reflow or decomposition when an etching method at a high temperature of 300° C. to 700° C. is used.

A semiconductor substrate manufactured by the method of the present invention may be usefully used in manufacturing of a compound semiconductor device having a group-III nitride compound layer.

The method of the present invention uses an etching method at a high temperature of 300° C. to 700° C. Therefore, a change of surface composition of the group-III nitride compound layer and generation of crystal defects can be suppressed.

MODES FOR CARRYING OUT THE INVENTION

Figure 1:
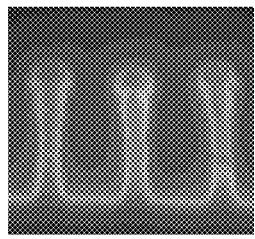
FIG. 1 is a SEM photograph of a pattern profile of a silicon wafer having a mask layer formed from a composition of Example 1 after etching at 250° C.
Figure 2:
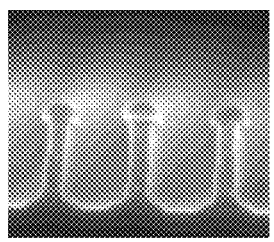
FIG. 2 is a SEM photograph of a pattern profile of the silicon wafer having the mask layer formed from the composition of Example 1 after etching at 300° C.
Figure 3:
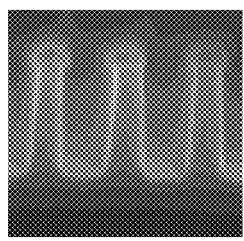
FIG. 3 is a SEM photograph of a pattern profile of the silicon wafer having the mask layer formed from the composition of Example 1 after etching at 400° C.
Figure 4:
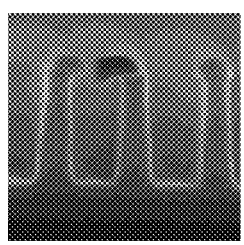
FIG. 4 is a SEM photograph of a pattern profile of the silicon wafer having the mask layer formed from the composition of Example 1 after etching at 500° C.
Figure 5:
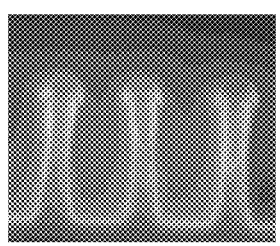
FIG. 5 is a SEM photograph of a pattern profile of a silicon wafer having a mask layer formed from a composition of Example 2 after etching at 250° C.
Figure 6:
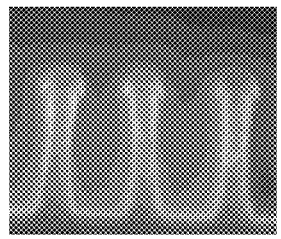
FIG. 6 is a SEM photograph of a pattern profile of the silicon wafer having the mask layer formed from the composition of Example 2 after etching at 300° C.
Figure 7:
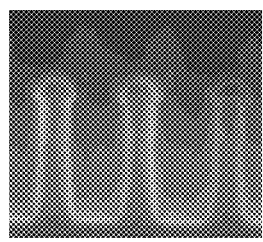
FIG. 7 is a SEM photograph of a pattern profile of the silicon wafer having the mask layer formed from the composition of Example 2 after etching at 400° C.
Figure 8:
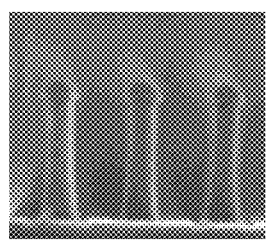
FIG. 8 is a SEM photograph of a pattern profile of the silicon wafer having the mask layer formed from the composition of Example 2 after etching at 500° C.
Figure 9:
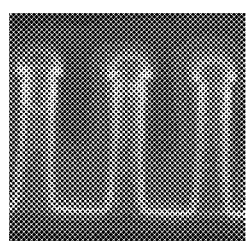
FIG. 9 is a SEM photograph of a pattern profile of a silicon wafer having a mask layer formed from a composition of Example 3 after etching at 250° C.
Figure 10:
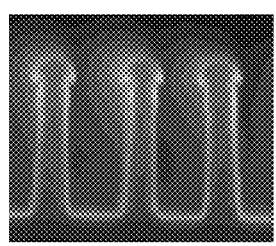
FIG. 10 is a SEM photograph of a pattern profile of the silicon wafer having the mask layer formed from the composition of Example 3 after etching at 300° C.
Figure 11:
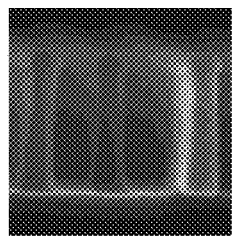
FIG. 11 is a SEM photograph of a pattern profile of the silicon wafer having the mask layer formed from the composition of Example 3 after etching at 400° C.
Figure 12:
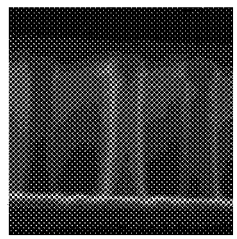
FIG. 12 is a SEM photograph of a pattern profile of the silicon wafer having the mask layer formed from the composition of Example 3 after etching at 500° C.

Hereinafter, the present invention will be described in detail.

A method for manufacturing a semiconductor substrate having a patterned group-III nitride compound layer is characterized in that the method comprises steps of: forming a patterned mask layer on a group-III nitride compound layer of the substrate, and etching the group-III nitride compound layer by dry etching at 300° C. or higher and 700° C. or lower using the mask pattern, to form a patterned group-III nitride compound layer. The patterned mask layer contains a polymer containing a unit structure of the following Formula (1):

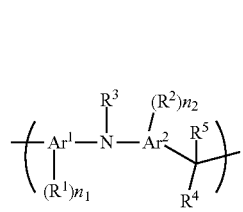

Formula (1)

(wherein $Ar^1$ and $Ar^2$ are each a benzene ring or a naphthalene ring, $R^1$ and $R^2$ are each a substituent of a hydrogen atom on the benzene ring or naphthalene ring and are each selected from the group consisting of a halogen group, a nitro group, an amino group, a hydroxy group, a $C_{1-10}$ alkyl group, a $C_{2-10}$ alkenyl group, a $C_{6-40}$ aryl group, and a combination thereof, the alkyl group, the alkenyl group, and the aryl group are an organic group optionally including an ether bond, a ketone bond, or an ester bond, $R^3$ is selected from the group consisting of a hydrogen atom, a $C_{1-10}$ alkyl group, a $C_{2-10}$ alkenyl group, a $C_{6-40}$ aryl group, and a combination thereof, the alkyl group, the alkenyl group, and the aryl group are an organic group optionally including an ether bond, a ketone bond, or an ester bond, $R^4$ is selected from the group consisting of a $C_{6-40}$ aryl group and a heterocyclic group, the aryl group and the heterocyclic group are an organic group optionally substituted with a halogen group, a nitro group, an amino group, a $C_{1-10}$ alkyl group, a $C_{1-10}$ alkoxy group, a $C_{6-40}$ aryl group, a formyl group, a carboxyl group, or a hydroxy group, $R^5$ is selected from the group consisting of a hydrogen atom, a $C_{1-10}$ alkyl group, a $C_{6-40}$ aryl group, and a heterocyclic group, the alkyl group, the aryl group, and the heterocyclic group are an organic group optionally substituted with a halogen group, a nitro group, an amino group, or a hydroxy group, $R^4$ and $R^5$ optionally form a ring together with a carbon atom to which $R^4$ and $R^5$ are bonded, and $n_1$ and $n_2$ are each an integer of 0 to 3), a polymer containing a unit structure of the following Formula (2):

Formula (2)

(wherein $Ar_1$ is an organic group containing a $C_{6-50}$ arylene group or a heterocyclic group), a polymer containing a structural unit of the following Formula (3):

Formula (3)

(wherein $Ar_2$, $Ar_3$, and $Ar_4$ are each an organic group containing a $C_{6-50}$ arylene group or a heterocyclic group, and T is a carbonyl group or a sulfonyl group), a polymer containing a combination of the unit structure of Formula (2) and the unit structure of Formula (3), or a crosslinked structure of the polymers.

Examples of group-III nitride compound usable in the present invention include GaN, AlN, and InN. GaN is preferable.

As described above, the patterned mask layer contains a polymer containing the unit structure of Formula (1), a polymer containing the unit structure of Formula (2), a polymer containing the structural unit of Formula (3), a polymer containing a combination of the unit structure of Formula (2) and the unit structure of Formula (3), or a crosslinked structure of the polymers.

The polymer containing the unit structure of Formula (1) has a weight average molecular weight of 600 to 1,000,000 or 600 to 200,000.

In Formula (1), $Ar^1$ and $Ar^2$ are each a benzene ring or a naphthalene ring, $R^1$ and $R^2$ are each a substituent of a hydrogen atom on the benzene ring or naphthalene ring and are each selected from the group consisting of a halogen group, a nitro group, an amino group, a hydroxy group, a $C_{1-10}$ alkyl group, a $C_{2-10}$ alkenyl group, a $C_{6-40}$ aryl group, and a combination thereof, the alkyl group, the alkenyl group, and the aryl group are an organic group optionally including an ether bond, a ketone bond, or an ester bond, $R^3$ is selected from the group consisting of a hydrogen atom, a $C_{1-10}$ alkyl group, a $C_{2-10}$ alkenyl group, a $C_{6-40}$ aryl group, and a combination thereof, the alkyl group, the alkenyl group, and the aryl group are an organic group optionally including an ether bond, a ketone bond, or an ester bond, $R^4$ is selected from the group consisting of a $C_{6-40}$ aryl group and a heterocyclic group, the aryl group and the heterocyclic group are an organic group optionally substituted with a halogen group, a nitro group, an amino group, a $C_{1-10}$ alkyl group, a $C_{1-10}$ alkoxy group, a $C_{6-40}$ aryl group, a formyl group, a carboxyl group, or a hydroxy group, $R^5$ is selected from the group consisting of a hydrogen atom, a $C_{1-10}$ alkyl group, a $C_{6-40}$ aryl group, and a heterocyclic group, the alkyl group, the aryl group, and the heterocyclic group are an organic group optionally substituted with a halogen group, a nitro group, an amino group, or a hydroxy group, $R^4$ and $R^5$ optionally form a ring together with a carbon atom to which $R^4$ and $R^5$ are bonded, and $n_1$ and $n_2$ are each an integer of 0 to 3.

Examples of the halogen atom include a fluorine atom, a chlorine atom, a bromine atom, and an iodine atom.

Examples of the $C_{1-10}$ alkyl group include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

Examples of the $C_{2-10}$ alkenyl group include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-i-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-i-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

Examples of the $C_{1-10}$ alkoxy group include methoxy group, ethoxy group, n-propoxy group, i-propoxy group, n-butoxy group, i-butoxy group, s-butoxy group, t-butoxy group, n-pentoxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-i-methyl-n-propoxy group, and 1-ethyl-2-methyl-n-propoxy group.

Examples of the $C_{6-40}$ aryl group include phenyl group, o-methylphenyl group, m-methylphenyl group, p-methylphenyl group, o-chlorophenyl group, m-chlorophenyl group, p-chlorophenyl group, o-fluorophenyl group, p-fluorophenyl group, o-methoxyphenyl group, p-methoxyphenyl group, p-nitrophenyl group, p-cyanophenyl group, α-naphthyl group, β-naphthyl group, o-biphenyl group, m-biphenyl group, p-biphenyl group, 1-anthryl group, 2-anthryl group, 9-anthryl group, 1-phenanthryl group, 2-phenanthryl group, 3-phenanthryl group, 4-phenanthryl group, 9-phenanthryl group, and pyrenyl group.

It is preferable that the heterocyclic group be an organic group including a 5- or 6-membered heterocycle containing nitrogen, sulfur, or oxygen. Examples thereof include pyrrole group, furan group, thiophene group, imidazole group, oxazole group, thiazole group, pyrazole group, isoxazole group, isothiazole group, and pyridine group.

In the unit structure of Formula (1), $R^5$ may be a hydrogen atom and $R^4$ may be a phenyl group, a naphthyl group, an anthryl group, or a pyrenyl group.

In the unit structure of Formula (1), $R^3$ may be a hydrogen atom or a phenyl group.

A unit structure (a1) wherein one of $Ar^1$ and $Ar^2$ in the unit structure of Formula (1) is a benzene ring and the other is a naphthalene ring may be used. A unit structure (a2) wherein both $Ar^1$ and $Ar^2$ in the unit structure of Formula (1) are a benzene ring may be used.

The polymer containing the unit structure of Formula (1) may be a copolymer containing the unit structure (a1) and the unit structure (a2).

The polymer containing the unit structure of Formula (1) may be a copolymer containing the unit structure of Formula (1) and a unit structure of the following Formula (4).

Formula (4)

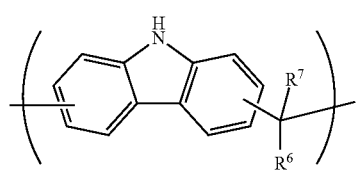

In the unit structure of Formula (4), $R^6$ is selected from the group consisting of a $C_{6-40}$ aryl group and a heterocyclic group, the aryl group and the heterocyclic group are an organic group optionally substituted with a halogen group, a nitro group, an amino group, a $C_{1-10}$ alkyl group, a $C_{1-10}$ alkoxy group, a $C_{6-40}$ aryl group, a formyl group, a carboxyl group, or a hydroxy group, $R^7$ is selected from the group consisting of a hydrogen atom, a $C_{1-10}$ alkyl group, a $C_{6-40}$ aryl group, and a heterocyclic group, the alkyl group, the aryl group, and the heterocyclic group are an organic group optionally substituted with a halogen group, a nitro group, an amino group, or a hydroxy group, and $R^6$ and $R^7$ may form a ring together with a carbon atom to which $R^6$ and $R^7$ are bonded.

As the substituent, alkyl group, aryl group, and heterocyclic group, those exemplified above can be used.

The polymer containing the unit structure of Formula (1) may be a copolymer containing the unit structure (a1) and the unit structure of Formula (4).

Examples of the polymer containing the unit structure of Formula (1) include as follows.

Formula (A-1)

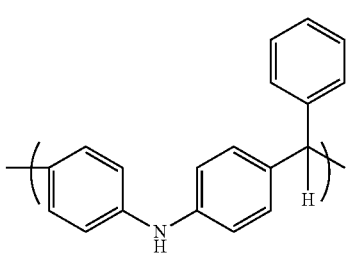

Formula (A-2)

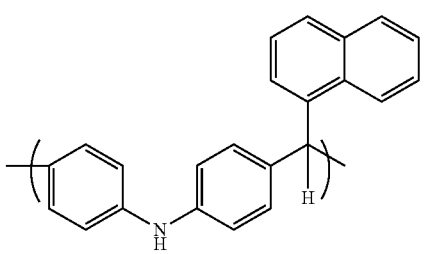

Formula (A-3)

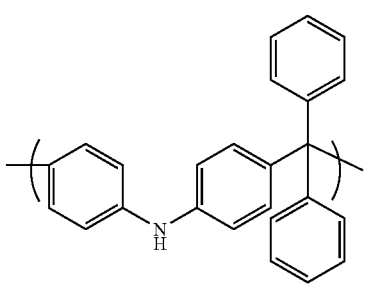

Formula (A-4)

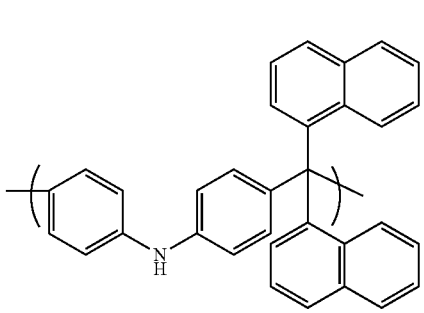

Formula (A-5)

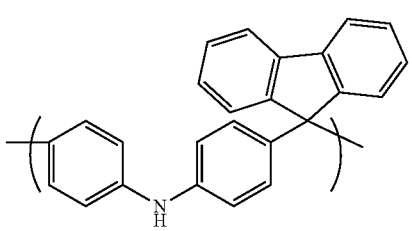

Formula (A-8)
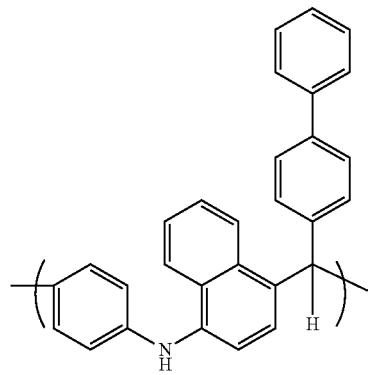
Formula (A-9)
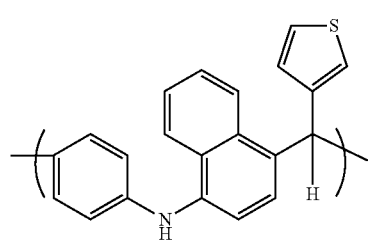
Formula (A-10)
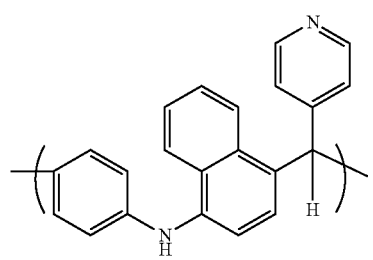
Formula (A-11)
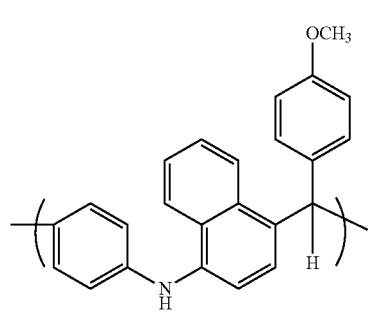
Formula (A-12)
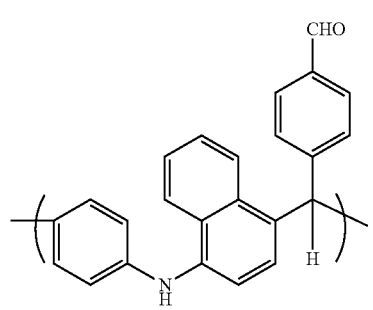
Formula (A-13)
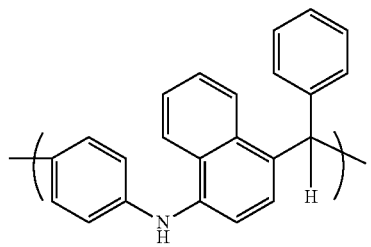
Formula (A-14)
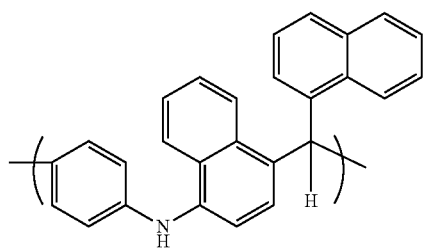
Formula (A-15)
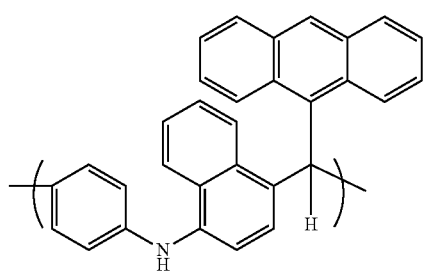
Formula (A-16)
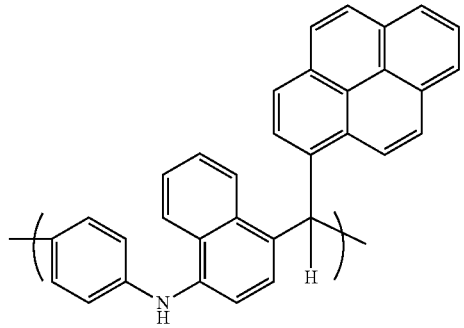
Formula (A-17)
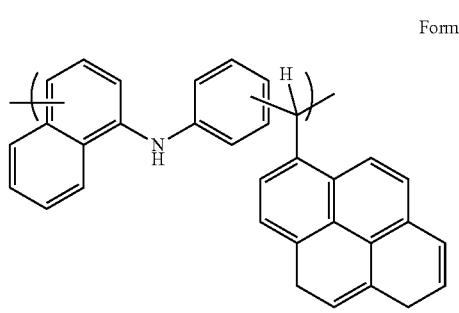

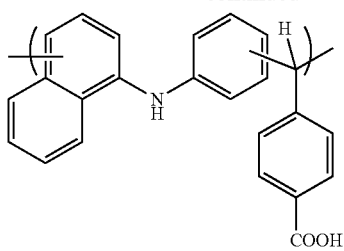

Formula (A-18)

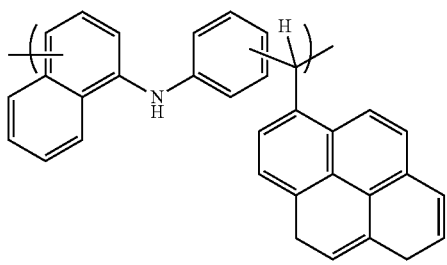

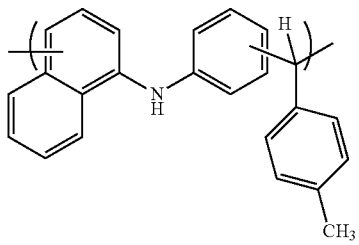

Formula (A-19)

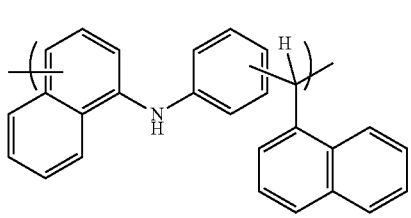

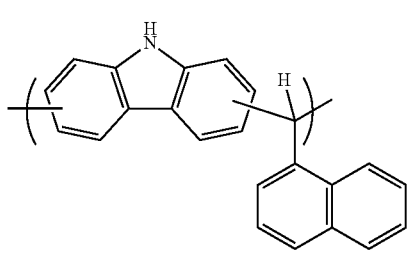

Formula (A-20)

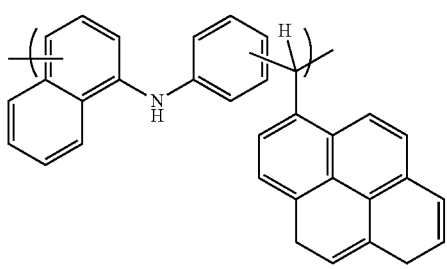

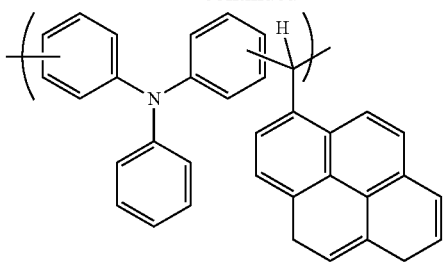

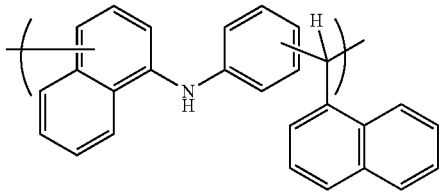

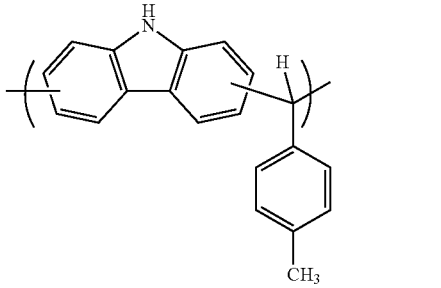

Formula (A-21)

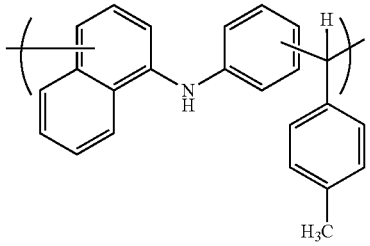

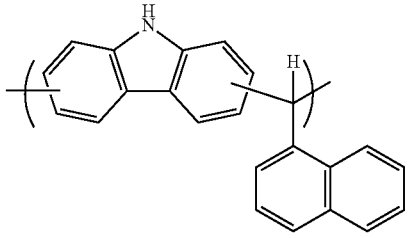

Examples of carbazole used for the polymer containing the unit structure of Formula (1) include carbazole, N-methylcarbazole, N-ethylcarbazole, 1,3,6,8-tetranitrocarbazole, 3,6-diaminocarbazole, 3,6-dibromo-9-ethylcarbazole, 3,6-dibromo-9-phenylcarbazole, 3,6-dibromocarbazole, 3,6-dichlorocarbazole, 3-amino-9-ethylcarbazole, 3-bromo-9-ethylcarbazole, 4,4'-bis(9H-carbazol-9-yl)biphenyl, 4-glycidylcarbazole, 4-hydroxycarbazole, 9-(1H-benzotriazol-1-ylmethyl)-9H-carbazole, 9-acetyl-3,6-diiodocarbazole, 9-benzoylcarbazole, 9-benzoylcarbazole-6-dicarboxyaldehyde, 9-benzylcarbazole-3-carboxyaldehyde, 9-methylcarbazole, 9-phenylcarbazole, 9-vinylcarbazole, carbazole potassium, carbazole-N-carbonyl chloride, N-ethylcarbazole-3-carboxaldehyde, and N-((9-ethylcarbazol-3-yl)methylene)-2-methyl-1-indolinylamine. The carbazole may be used alone, or two or more kinds thereof may be used in combination.

Examples of triphenylamine used for the polymer containing the unit structure of Formula (1) include triphenylamine and substituted triphenylamine. Examples of substituent include the aforementioned halogen group, nitro group, amino group, hydroxy group, $C_{1-10}$ alkyl group, $C_{2-10}$ alkenyl group, and $C_{6-40}$ aryl group, and a combination of the alkyl group, the alkenyl group, and the aryl group that may include an ether bond, a ketone bond, or an ester bond.

Examples of aldehyde used in manufacturing of the polymer containing the unit structure of Formula (1) include saturated aliphatic aldehydes such as formaldehyde, paraformaldehyde, acetaldehyde, propylaldehyde, butyraldehyde, isobutyraldehyde, valeraldehyde, capronaldehyde, 2-methylbutyraldehyde, hexylaldehyde, undecanealdehyde, 7-methoxy-3,7-dimethyloctyladehyde, cyclohexanealdehyde, 3-methyl-2-butyraldehyde, glyoxal, malonaldehyde, succinaldehyde, glutaraldehyde, glutaraldehyde, and adipalaldehyde; unsaturated aliphatic aldehydes such as acrolein and methacrolein; heterocyclic aldehydes such as furfural, pyridinealdehyde, and thiophenealdehyde; and aromatic aldehydes such as benzaldehyde, naphthaldehyde, anthracenecarboxyaldehyde, phenylbenzaldehyde, anisaldehyde, terephthalaldehyde, pyrenecarboxaldehyde, phenanthrylaldehyde, salicylaldehyde, phenylacetaldehyde, 3-phenylpropionaldehyde, tolylaldehyde, (N,N-dimethylamino)benzaldehyde, and acetoxybenzaldehyde. In particular, an aromatic aldehyde can be preferably used.

Examples of ketone used in manufacturing of the polymer containing the unit structure of Formula (1) include diaryl ketones such as diphenyl ketone, phenyl naphthyl ketone, dinaphtyl ketone, phenyl tolyl ketone, ditolyl ketone, and 9-fluorenone.

The polymer containing the unit structure of Formula (1) is a novolac resin (corresponding to Formula (1)) obtained by condensation of an amine such as diaryl amine with an aldehyde or ketone.

In this condensation reaction, the aldehyde or ketone can be used in an amount of 0.1 to 10 equivalent weights relative to 1 equivalent weight of phenyl group of the amine such as diaryl amine.

As an acid catalyst used in the condensation reaction, for example, a mineral acid such as sulfuric acid, phosphoric acid, and perchloric acid, an organic sulfonic acid such as p-toluene sulfonic acid and para-toluenesulfonic acid monohydrate, or a carboxylic acid such as formic acid and oxalic acid is used. The amount of acid catalyst to be used is variously selected depending on the kind of used acid. The amount is usually 0.001 to 10,000 parts by mass, preferably 0.01 to 1,000 parts by mass, and more preferably 0.1 to 100 parts by mass, relative to 100 parts by mass of carbazole or the total of carbazole and triphenylamine.

The condensation reaction is carried out without a solvent, but the concentration reaction is usually carried out using a solvent. Any solvent can be used as long as it does not inhibit the reaction. Examples thereof include a cyclic ether such as tetrahydrofuran and dioxane. When the used acid catalyst is liquid, such as formic acid, the acid catalyst can also serve as the solvent.

The reaction temperature in condensation is usually 40° C. to 200° C. The reaction time is variously selected depending on the reaction temperature, and is usually about 30 minutes to about 50 hours.

The weight average molecular weight Mw of the polymer containing the unit structure of Formula (1) obtained as described above is usually 600 to 1,000,000 or 600 to 200,000.

Hereinafter, the polymer containing the unit structure of Formula (2), the polymer containing the structural unit of Formula (3), the polymer containing a combination of the unit structure of Formula (2) and the unit structure of Formula (3), or a crosslinked structure of the polymers will be described.

The unit structure of Formula (2) is a unit structure having a polyether structure. The unit structure of Formula (3) is a unit structure having a polyether ether ketone structure or a polyether ether sulfone structure.

$Ar_1$ in the unit structure of Formula (2) is an organic group containing a $C_{6-50}$ arylene group or a heterocyclic group. For example, the organic group has two to four valences. In Formula (3), $Ar_2$, $Ar_3$, and $Ar_4$ are each an organic group containing a $C_{6-50}$ arylene group or a heterocyclic group, and T is a carbonyl group or a sulfonyl group. One or two or more kinds of the arylene group or heterocyclic group in the organic group of $Ar_1$ to $Ar_4$ may be used in combination. For example, the arylene group and heterocyclic group have two to four valences.

The $C_{6-50}$ arylene group is a divalent organic group corresponding to aryl group. Examples thereof include divalent groups corresponding to phenyl group, o-methylphenyl group, m-methylphenyl group, p-methylphenyl group, o-chlorophenyl group, m-chlorophenyl group, p-chlorophenyl group, o-fluorophenyl group, p-fluorophenyl group, o-methoxyphenyl group, p-methoxyphenyl group, p-nitrophenyl group, p-cyanophenyl group, ca-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group, 9-phenanthryl group, fluorene group, fluorene derivative group, pyrene group, and pentacene group.

As the heterocyclic group, an organic group corresponding to a heterocycle such as pyrrole, thiophene, furan, imidazole, triazole, oxazole, thiazole, pyrazole, isoxazole, isothiazole, pyridine, pyridazine, pyrimidine, pyrazine, piperidine, piperazine, morpholine, pyran, and carbazole may be used.

As the organic group containing the $C_{6-50}$ arylene group, the aforementioned arylene group may be used alone or in combination with a group containing a carbon-carbon triple bond and/or a group containing a carbon-carbon double bond.

As the organic group containing the aforementioned arylene group, an organic group containing a fluorene structure or an organic group containing a biphenylene structure may be used.

Examples of the unit structure of Formula (2) and the unit structure of Formula (3) include the following unit structures.

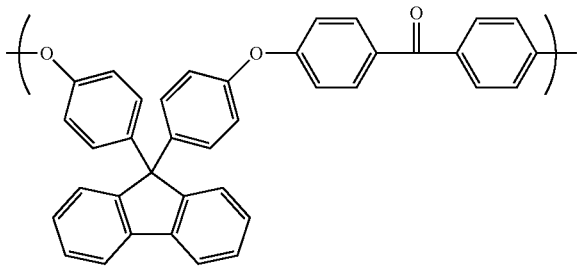

Formula (B-1)

Formula (B-2)
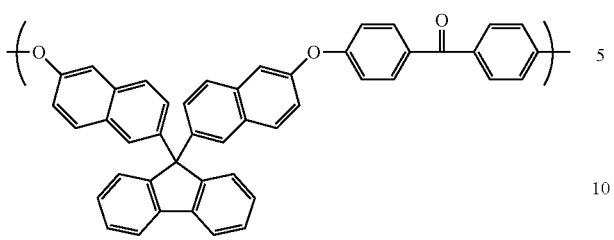

Formula (B-3)
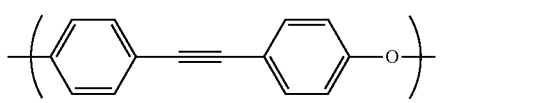

Formula (B-4)
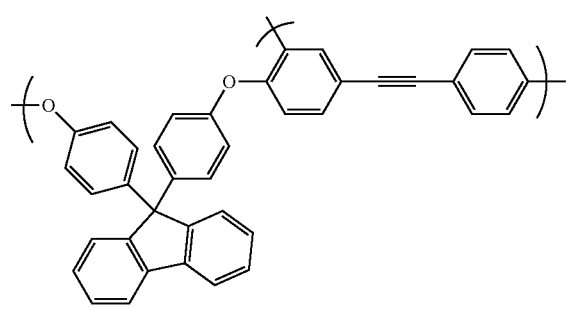

Formula (B-5)
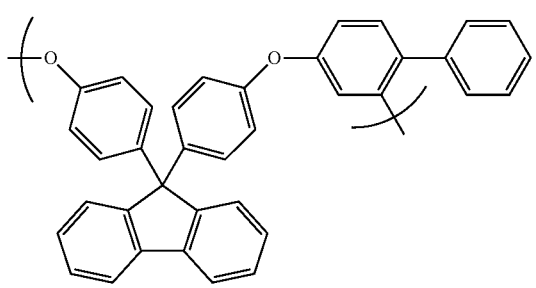

Formula (B-6)
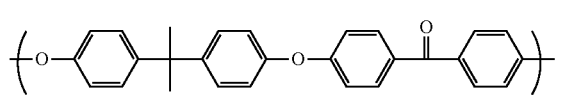

Formula (B-7)
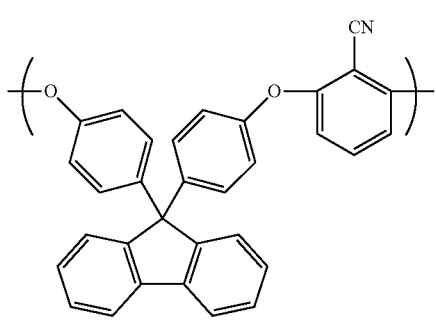

Formula (B-8)
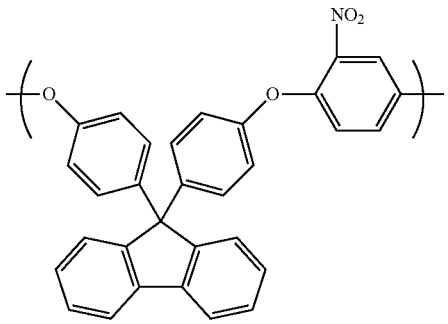

The polymer containing the unit structure of Formula (2), the polymer containing the structural unit of Formula (3), the polymer containing a combination of the unit structure of Formula (2) and the unit structure of Formula (3), or a crosslinked structure of the polymers has a weight average molecular weight of 600 to 1,000,000, and preferably 1,000 to 200,000.

The method for manufacturing a semiconductor substrate having a patterned group-III nitride compound layer of the present invention includes a step of forming a patterned mask layer on the group-III nitride compound layer of the substrate.

The mask layer is formed on the group-III nitride compound layer using a mask-forming composition containing the polymer containing the unit structure of Formula (1), the polymer containing the unit structure of Formula (2), the polymer containing the structural unit of Formula (3), the polymer containing a combination of the unit structure of Formula (2) and the unit structure of Formula (3), or a crosslinked structure of the polymers.

In addition to the polymer containing the unit structure of Formula (1), the polymer containing the unit structure of Formula (2), the polymer containing the structural unit of Formula (3), the polymer containing a combination of the unit structure of Formula (2) and the unit structure of Formula (3), or a crosslinked structure of the polymers, the mask-forming composition may contain a crosslinker and an acid, and if necessary, an additive such as an acid generator and a surfactant.

The solid content of the mask-forming composition is 0.1 to 70% by mass or 0.1 to 60% by mass. The solid content is a content ratio of all components other than a solvent in the mask-forming composition. The solid content may contain the polymer in an amount of 1 to 100% by mass, 1 to 99% by mass, or 50 to 99.9%.

The mask-forming composition may contain a crosslinker component. Examples of the crosslinker include a melamine-based crosslinker, a substituted urea-based crosslinker, and polymers thereof. A crosslinker having at least two crosslinking-forming substituents is preferable. Examples thereof include compounds such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and methoxymethyl thiourea. A condensate of the compounds may be also used.

As the crosslinker, a crosslinker having high heat resistance may be used. As the crosslinker having high heat resistance, a compound containing a crosslinking-forming substituent having an aromatic ring (e.g., a benzene ring or a naphthalene ring) in the molecule may be preferably used.

Examples of the compound include a compound having a partial structure of the following Formula (5) and a polymer and oligomer having a repeating unit of the following Formula (6).

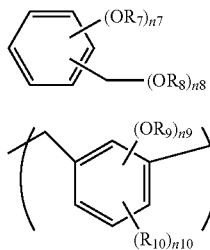

Formula (5)

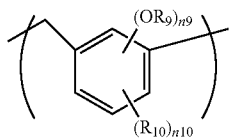

Formula (6)

In Formula (5), $R_7$ and $R_8$ are each a hydrogen atom, a $C_{1-10}$ alkyl group, or a $C_{6-20}$ aryl group, n7 is an integer of 1 to 4, n8 is an integer of 1 to (5-n7), and n7+n8 is an integer of 2 to 5. In Formula (6), $R_9$ is a hydrogen atom or a $C_{1-10}$ alkyl group, $R_{10}$ is a $C_{1-10}$ alkyl group, n9 is an integer of 1 to 4, n10 is an integer of 0 to (4-n9), and n9+n10 is an integer of 1 to 4. The oligomer and polymer in which the number of repeating unit structures falls within a range of 2 to 100 or 2 to 50 may be used. Examples of the alkyl group and aryl group include those exemplified above.

Examples of the compound, polymer, and oligomer of Formula (5), and the compound, polymer, and oligomer of Formula (6) include as follows.

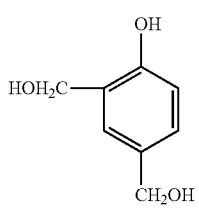

Formula (C-1)

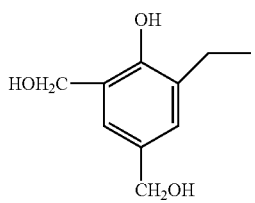

Formula (C-2)

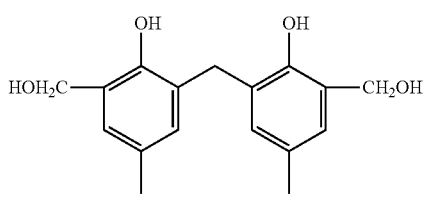

Formula (C-3)

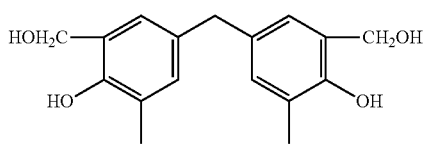

Formula (C-4)

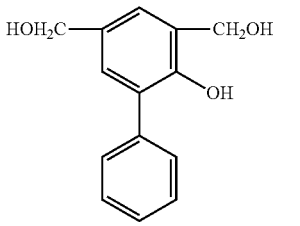

Formula (C-5)

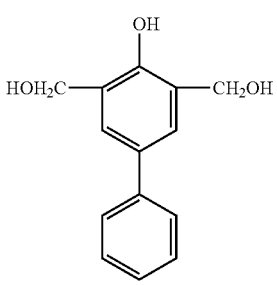

Formula (C-6)

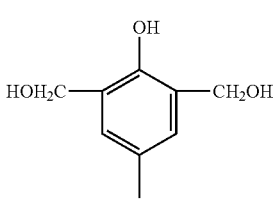

Formula (C-7)

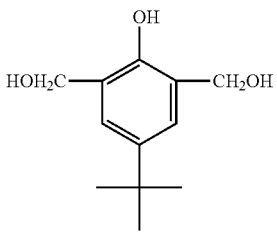

Formula (C-8)

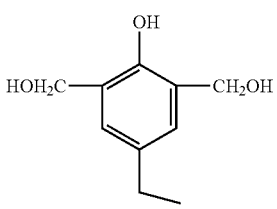

Formula (C-9)

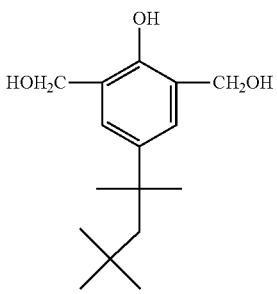

Formula (C-10)

-continued
Formula (C-11)
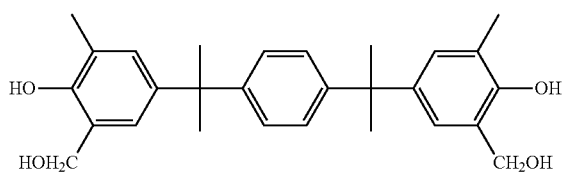
Formula (C-12)
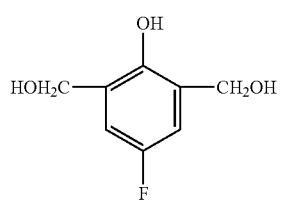
Formula (C-13)
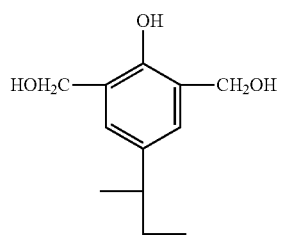
Formula (C-14)
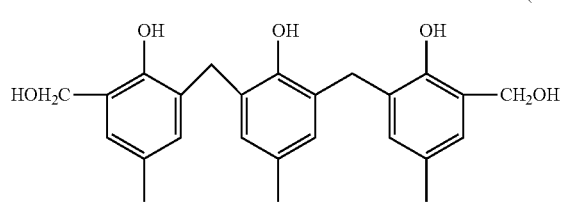
Formula (C-15)
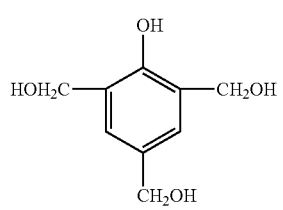
Formula (C-16)
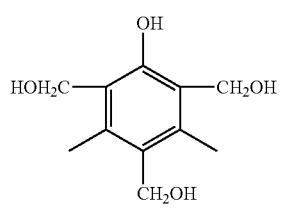
Formula (C-17)
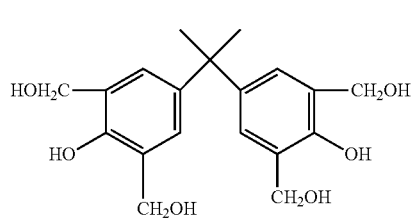
Formula (C-18)
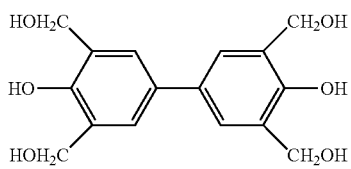
Formula (C-19)
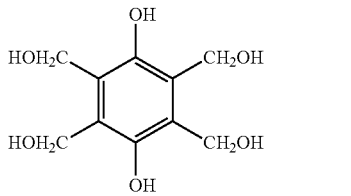
Formula (C-20)
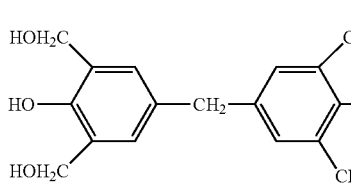
Formula (C-21)
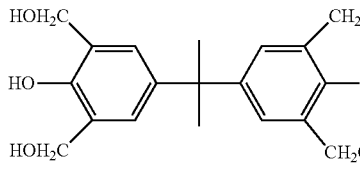
Formula (C-22)
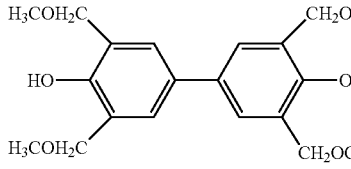
Formula (C-23)
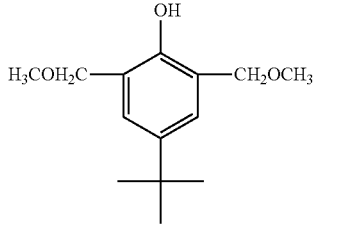
Formula (C-24)
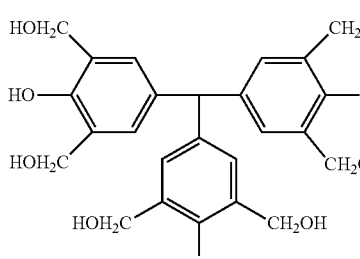
Formula (C-25)
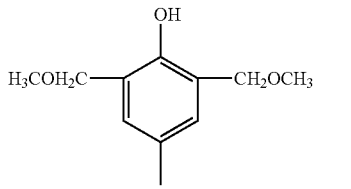

-continued

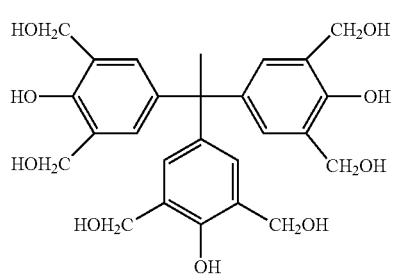

Formula (C-26)

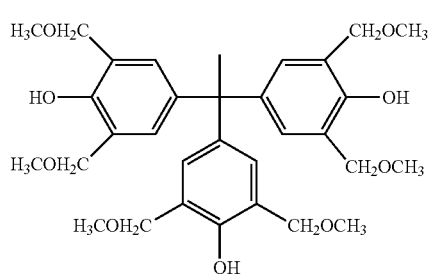

Formula (C-27)

The compounds described above are available as products available from Asahi Organic Chemicals Industry Co., Ltd., and Honshu Chemical Industry Co., Ltd. Among the crosslinkers, for example, the compound of Formula (C-21) is available as trade name TM-BIP-A available from Asahi Organic Chemicals Industry Co., Ltd. Among the crosslinkers, for example, the compound of Formula (C-22) is available as trade name TMOM-BP available from Honshu Chemical Industry Co., Ltd.

The amount of crosslinker to be added varies depending on a coating solvent to be used, a substrate to be used, a solution viscosity to be required, and a film form to be required. The amount is 0.001 to 80% by mass, preferably 0.01 to 50% by mass, and further preferably 0.05 to 40% by mass, relative to the total solid content. The crosslinker may cause a crosslinking reaction due to self-condensation. When a crosslinkable substituent is included in the polymer containing the unit structure of Formula (1), the polymer containing the unit structure of Formula (2), the polymer containing the structural unit of Formula (3), the polymer containing a combination of the unit structure of Formula (2) and the unit structure of Formula (3), or a crosslinked structure of the polymers, the crosslinker may cause a crosslinking reaction with the crosslinkable substituent.

As a catalyst for promoting the crosslinking reaction, an acidic compound such as p-toluenesulfonic acid, trifluoromethanesulfonic acid, pyridinium p-toluenesulfonic acid, salicylic acid, sulfosalicylic acid, citric acid, benzoic acid, hydroxybenzoic acid, and naphthalenecarboxylic acid, and/or a thermal acid generator such as 2,4,4,6-tetrabromocyclohexadienone, benzoin tosylate, 2-nitrobenzyl tosylate, and other organic sulfonic acid alkyl ester may be mixed. The amount of catalyst to be mixed is 0.0001 to 20% by mass, preferably 0.0005 to 10% by mass, and further preferably 0.01 to 3% by mass, relative to the total solid content.

The mask-forming composition may contain a photoacid generator to make the acidity of the mask-forming composition coincide with the acidity of a photoresist covered as an upper layer in a lithography step. Preferable examples of the photoacid generator include onium salt-based photoacid generators such as bis(4-t-butylphenyl)iodonium trifluoromethanesulfonate and triphenylsulfonium trifluoromethanesulfonate, halogen-containing compound-based photoacid generators such as phenyl-bis(trichloromethyl)-s-triazine, and sulfonic acid-based photoacid generators such as benzoin tosylate and N-hydroxysuccinimide trifluoromethanesulfonate. The amount of the photoacid generator is 0.2 to 10% by mass, and preferably 0.4 to 5% by mass, relative to the total solid content.

The mask-forming composition may further contain a light absorber, a rheology modifier, an adhesive adjuvant, a surfactant, or the like, if necessary.

As the light absorber, a commercially available light absorber described in "Kogyoyoshikiso no gijutsu to shijo" (CMC Publishing Co., Ltd.) or "Senryo binran" (edited by The Society of Synthetic Organic Chemistry, Japan.), for example, C. I. Disperse Yellow 1, 3, 4, 5, 7, 8, 13, 23, 31, 49, 50, 51, 54, 60, 64, 66, 68, 79, 82, 88, 90, 93, 102, 114, or 124; C. I. Disperse Orange 1, 5, 13, 25, 29, 30, 31, 44, 57, 72, or 73; C. I. Disperse Red 1, 5, 7, 13, 17, 19, 43, 50, 54, 58, 65, 72, 73, 88, 117, 137, 143, 199, or 210; C. I. Disperse Violet 43; C. I. Disperse Blue 96; C. I. Fluorescent Brightening Agent 112, 135, or 163; C. I. Solvent Orange 2, or 45; C. I. Solvent Red 1, 3, 8, 23, 24, 25, 27, or 49; C. I. Pigment Green 10; C. I. Pigment Brown 2, or the like, can be suitably used. The light absorber is usually mixed in an amount of 10% by mass or less, and preferably 5% by mass or less, relative to the total solid content of the mask-forming composition.

The rheology modifier is added to mainly improve the flowability of the mask-forming composition, and in particular, to improve the film thickness uniformity of a mask layer and enhance the packing properties of the inside of holes with the mask-forming composition in a baking step. Specific examples thereof include phthalic acid derivatives such as dimethyl phthalate, diethyl phthalate, diisobutyl phthalate, dihexyl phthalate, and butylisodecyl phthalate, adipic acid derivatives such as di-n-butyl adipate, diisobutyl adipate, diisooctyl adipate, and octyldecyl adipate, maleic acid derivatives such as di-n-butyl maleate, diethyl maleate, and dinonyl maleate, oleic acid derivatives such as methyl oleate, butyl oleate, and tetrahydrofurfuryl oleate, and stearic acid derivatives such as n-butyl stearate and glyceryl stearate. The rheology modifier is usually mixed in an amount of less than 30% by mass relative to the total solid content of the mask-forming composition.

The adhesive adjuvant is added to mainly improve the adhesion of the mask-forming composition to a substrate or a resist, and in particular, to prevent separation of the resist in development. Specific examples thereof include chlorosilanes such as trimethylchlorosilane, dimethylvinylchlorosilane, methyldiphenylchlorosilane, and chloromethyldimethylchlorosilane, alkoxysilanes such as trimethylmethoxysilane, dimethyldiethoxysilane, methyldimethoxysilane, dimethylvinylethoxysilane, diphenyldimethoxysilane, and phenyltriethoxysilane, silazanes such as hexamethyldisilazane, N,N'-bis(trimethylsilyl)urea, dimethyltrimethylsilylamine, and trimethylsilylimidazole, silanes such as vinyltrichlorosilane, γ-chloropropyltrimethoxysilane, γ-aminopropyltriethoxysilane, and γ-glycidoxypropyltrimethoxysilane, heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine, urea compounds such as 1,1-dimethylurea and 1,3-dimethylurea, and thiourea compounds. The adhesive adjuvant is usually mixed in an amount of less than 5% by mass, and preferably less than 2% by mass, relative to the total solid content of the mask-forming composition.

The surfactant can be mixed in the mask-forming composition to further improve the coating properties against unevenness of a surface without generating pinholes and striation. Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorosurfactants including Eftop EF301, EF303, and EF352 (trade name, available from Tohkem Products Corporation), MEGAFACE F171, F173, and R-30 (trade name, available from DIC Corporation), Fluorad FC430 and FC431 (trade name, available from Sumitomo 3M, Ltd.), and Asahi Guard AG710, and Surflon S-382, SC101, SC102, SC103, SC104, SC105, and SC106 (trade name, available from Asahi Glass Co., Ltd.), and organosiloxane polymer KP341 (available from Shin-Etsu Chemical Co., Ltd.). The amount of surfactant to be mixed is usually 2.0% by mass or less, and preferably 1.0% by mass or less, relative to the total solid content of the mask-forming composition. The surfactant may be added alone, or two or more kinds thereof may be added in combination.

As a solvent for dissolving the polymer containing the unit structure of Formula (1), the polymer containing the unit structure of Formula (2), the polymer containing the structural unit of Formula (3), the polymer containing a combination of the unit structure of Formula (2) and the unit structure of Formula (3), or the crosslinked structure of the polymers, the crosslinker component, the crosslinking catalyst, or the like, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, or the like can be used. The organic solvent is used alone, or two or more kinds thereof are used in combination.

Further, the organic solvent may be used in a mixture with a solvent having a high boiling point such as propylene glycol monobutyl ether and propylene glycol monobutyl ether acetate may be used. Among the solvents, propylene glycol monomethyl ether, propylene glycol monomethyl ether acetate, ethyl lactate, butyl lactate, and cyclohexanone are preferable in terms of improved leveling properties.

A mask layer is formed on the group-III nitride compound layer of the substrate by applying the mask-forming composition by an appropriate coating method such as a spinner and a coater followed by baking to cure the mask-forming composition. The thickness of the mask layer is preferably 0.01 to 3.0 µm. A baking condition after applying is at 80 to 350° C. for 0.5 to 120 minutes.

It is preferable that the mask layer be formed from the mask-forming composition by a spin coating method.

Hereinafter, a method for patterning the mask layer will be described.

In an aspect of the method of the present invention, a patterned mask layer may be formed by steps of forming the mask layer on the group-III nitride compound layer, forming an organic film on the mask layer, forming an organic pattern from the organic film by lithography, and patterning the mask layer through the organic pattern.

A material used in formation of the organic film is not particularly limited as long as it is a material used as a photoresist. As a method for forming the organic film, a method usually used can be adopted. In formation of the organic pattern by lithography, a method used in usual lithography can be adopted. For example, the organic pattern may be formed by pattern irradiation with light or an electron beam through a photomask, followed by development, or by using nanoimprint. For example, the mask layer may be patterned through the organic pattern by dry etching using an $O_2$ gas or the like.

For example, the aforementioned manufacturing method in which the organic film is a resist film, and the formation of the organic pattern by lithography is formation of a resist pattern by irradiation of the resist film with light or an electron beam followed by development is preferable.

In another aspect of the method of the present invention, the patterned mask layer may be formed by steps of forming the mask layer on the group-III nitride compound layer, forming a hard mask on the mask layer, forming an organic film on the hard mask, forming an organic pattern from the organic film by lithography, patterning the hard mask through the organic pattern, and patterning the mask layer through the patterned hard mask.

A material used in formation of the hard mask is not particularly limited as long as it is a material used as a hard mask. As a method for forming the hard mask, a method usually used can be adopted. As the material for a hard mask, a silicon-containing composition is preferably used. Examples thereof include a silicon-containing hard mask formed from a silicon-containing resist underlayer-forming composition described in International Publication No. 2009/104552 pamphlet and International Publication No. 2011/102470 pamphlet. A material used in formation of the organic film is not particularly limited as long as it is a material used as a photoresist. As a method for forming the organic film, a method usually used can be adopted. In formation of the organic pattern by lithography, the organic pattern can be formed by pattern irradiation with light or an electron beam through a photomask followed by development. However, a method used in usual lithography can be adopted. For example, the hard mask can be patterned through the organic pattern by dry etching using a $CF_4$ gas or the like. For example, the mask layer can be patterned through the patterned hard mask by dry etching using an $O_2$ gas or the like.

The method for manufacturing a semiconductor substrate having a patterned group-III nitride compound layer includes steps of: etching the group-III nitride compound layer by dry etching at 300° C. or higher and 700° C. or lower using the mask pattern, to form a patterned group-III nitride compound layer.

In the dry etching at 300° C. or higher and 700° C. or lower, dry etching can be carried out by using an etching gas with the temperature of the substrate kept within a range of 300° C. or higher and 700° C. or lower.

The etching gas may include a rare gas such as He, Ne, Ar, Kr, Xe, and Rn. The etching as may include $H_2$, $O_2$, $N_2$, $CCl_3$, $BCl_3$, or $SiCl_4$ that is reductive. Accordingly, examples of an etching gas containing $Cl_2$ include a mixed gas of $Cl_2$ and Ar, a mixed gas of $Cl_2$, $H_2$, and Ar, a mixed gas of $Cl_2$ and $BCl_3$, and a mixed gas of $Cl_2$ and $N_2$. The etching gas containing $Cl_2$ is preferable.

The temperature of the substrate is 300° C. or higher and 700° C. or lower, for example, 300° C. or higher and 500° C. or lower, 400° C. or higher and 600° C. or lower, 450° C. or higher and 550° C. or lower, or 500° C.

The etching time is usually about 1 minute to about 5 minutes. The etching time can be set to a different time depending on the degree of etching, the kind of the group-III nitride compound layer to be etched, and the state of surface of the group-III nitride compound layer.

The method of the present invention uses an etching method at a high temperature of 300° C. to 700° C. Therefore, a change of surface composition of the group-III nitride compound layer and generation of crystal defects can be suppressed.

The present invention also relates to a substrate having the patterned mask layer on the group-III nitride compound layer.

In the group-III nitride compound layer on the substrate, a change of surface composition and generation of crystal defects are suppressed. A patterned mask layer whose pattern is not collapsed even at high temperature due to reflow or decomposition is formed on the group-III nitride compound layer. Therefore, a subsequent process for formation of a semiconductor can be advantageously carried out.

Moreover, the present invention relates to a method for manufacturing a compound semiconductor device having a group-III nitride compound layer comprising a step of further processing a semiconductor substrate obtained by the method described above.

Examples of processing include a step of growing a crystal (AlGaN, etc.) on the patterned group-III nitride compound layer and a step of producing an electrode.

In the group-III nitride compound layer on the substrate, a change of surface composition and generation of crystal defects are suppressed, as described above. The patterned mask layer whose pattern is not collapsed even at high temperature due to reflow or decomposition is formed on the group-III nitride compound layer. Therefore, a compound semiconductor device can be advantageously manufactured.

EXAMPLES

Synthesis Example 1

In a flask equipped with a stirrer, a reflux condenser, and a thermometer, 28.04 g of 9,9-bis(4-hydroxyphenyl)fluorene, 13.97 g of 4,4'-difluorobenzophenone, 12.32 g of potassium carbonate, and 162.56 g of N-methyl-2-pyrrolidinone were placed. Subsequently, the inside of the flask was replaced with nitrogen, the mixture was then heated until the inner temperature was 140° C., and a reaction was caused for about 24 hours. The synthesized polymer was cooled to room temperature, and then filtered, to remove a precipitate. The filtrate was collected, and mixed with about 10 mL of a mixed liquid of N-methyl-2-pyrrolidinone and 2 mol/L hydrochloric acid at a volume ratio of 90:10. The reaction filtrate was added to methanol, resulting in reprecipitation.

The precipitate was washed with water and methanol, and dried under vacuum at 85° C. for about 1 day. As a result, a polyether to be used in the present invention was obtained. The obtained polymer corresponded to Formula (1-1). The obtained polymer having an ether structure was analyzed by GPC. The weight average molecular weight thereof in terms of standard polystyrene was 6,900. The polydispersity index Mw/Mn thereof was 1.83.

Formula (1-1)

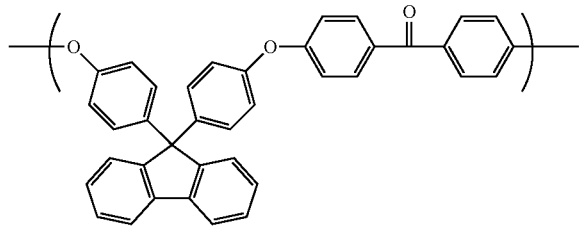

Synthesis Example 2

In a 100-mL four-neck flask, N-phenyl-1-naphthylamine (8.00 g, 0.036 mol, available from Tokyo Chemical Industry Co., Ltd.), 1-pyrenecarboxyaldehyde (8.39 g, 0.036 mol, available from Tokyo Chemical Industry Co., Ltd.), and para-toluenesulfonic acid monohydrate (0.727 g, 0.0036 mol, available from Kanto Chemical Co., Inc.) were placed, and 1,4-dioxane (21.03 g, available from Kanto Chemical Co., Inc.) was then placed. The mixture was stirred, heated to 110° C., and dissolved. As a result, polymerization started. After 12 hours, the resultant was allowed to stand to cool to room temperature. In methanol (400 g, available from Kanto Chemical Co., Inc.), reprecipitation was caused. The obtained precipitate was subjected to filtration, dried at 50° C. for 10 hours and at 120° C. for 24 hours by a reduced-pressure dryer, to obtain 8.4 g of target polymer (Formula (1-2), hereinafter abbreviated as pNPNA-Py).

The weight average molecular weight Mw of pNPA-Py measured by GPC in terms of polystyrene was 1,000, and the polydispersity index Mw/Mn thereof was 1.37.

Formula (1-2)

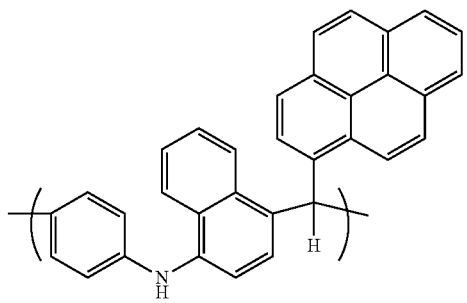

Example 1

3 g of the resin obtained in Synthesis Example 1 was dissolved in 12 g of cyclohexanone, to prepare a solution serving as a solution of a mask-forming composition.

Example 2

0.3 g of TMOM-BP (available from Honshu Chemical Industry Co., Ltd., Formula (C-22)) as a crosslinker, 0.05 g of TAG-2689 (available from Kusumoto Chemicals, Ltd.) as a catalyst, and 0.004 g of MEGAFACE R-40LM (available from DIC Corporation) as a surfactant were mixed in 2.0 g of the polymer obtained in Synthesis Example 1. The mixture was dissolved in 4.23 g of propylene glycol monomethyl ether acetate (PGMEA), 4.23 g of propylene glycol monomethyl ether (PGME), and 12.68 g of cyclohexanone to obtain a solution. The solution was then filtered through a polyethylene microfilter having a pore size of 0.10 μm to prepare a mask-forming composition.

Example 3

0.4 g of TMOM-BP (available from Honshu Chemical Industry Co., Ltd., Formula (C-22)) as a crosslinker, 0.06 g of pyridinium p-toluenesulfonate as a catalyst, and 0.001 g of MEGAFACE R-40LM (available from DIC Corporation) as a surfactant were mixed in 2.0 g of the polymer obtained in Synthesis Example 2. The mixture was dissolved in 7.31 g of propylene glycol monomethyl ether acetate (PGMEA), 2.44 g of propylene glycol monomethyl ether (PGME), and 14.63 g of cyclohexanone to obtain a solution. The solution was then filtered through a polyethylene microfilter having a pore size of 0.10 μm to prepare a mask-forming composition.

Comparative Example 1

A solution of cresol novolac resin (commercially available product, weight average molecular weight: 4,000) was used.

Comparative Example 2

3 g of polyethylene glycol having a molecular weight of 1,000 (available from Tokyo Chemical Industry Co., Ltd.) was dissolved in 12 g of propylene glycol monoethyl ether acetate to obtain a solution.

Test Example 1 (Heat Resistance Test of Film)

The solution of the mask-forming composition prepared in each of Examples 1 to 3 and Comparative Examples 1 and 2 was applied to a silicon wafer using a spin coater. The silicon wafer was baked on a hot plate at 240° C. for 1 minute and at 400° C. for 1 minute to form a mask layer (thickness: 0.20 μm). A film on the wafer was scratched, to obtain a powder of the mask layer. The obtained powder was heated at a rate of 10° C./minute, and thermogravimetric analysis was carried out in air. The temperature at which the mass was decreased by 5% was measured. The results are shown in Table 1.

TABLE 1

Temperature at which the mass of a film was decreased by 5%
Film baked at 240° C. for 1 minute and at 400° C. for 1 minute

| | |
|---|---|
| Example 1 | 508° C. |
| Example 2 | 433° C. |
| Example 3 | 409° C. |
| Comparative Example 1 | Not measured because sublimation occurred during baking at 400° C. |
| Comparative Example 2 | Not measured because sublimation occurred during baking at 400° C. |

(Confirmation of Pattern Profile after High-Temperature Etching)

The pattern profile after high-temperature etching was confirmed. The solution of the mask-forming composition adjusted in each of Examples 1 to 3 was first applied to a silicon wafer using a spin coater. The silicon wafer was baked on a hot plate at 240° C. for 1 minute and at 450° C. for 1 minute to form a mask layer (thickness: 200 nm). A silicon hard mask-forming composition solution corresponding to Example 15 of International Publication No. 2009/104552 pamphlet was applied to the mask, and baked at 240° C. for 1 minute, to form a silicon hard mask layer (thickness: 40 nm). A resist solution was applied to the silicon hard mask layer, and baked at 100° C. for 1 minute, to form a resist layer (thickness: 120 nm). The resist layer was exposed to light with a wavelength of 193 nm through a photomask, and subjected to post exposure bake (PEB) (at 105° C. for 1 minute), followed by development. As a result, a resist pattern of lines and spaces was obtained. Subsequently, dry etching with a fluorine-based gas (component: $CF_4$) was carried out to transfer the resist pattern to the hard mask. Dry etching with an oxygen-based gas (component: $O_2$) was carried out to transfer the hard mask pattern to the mask layer. The size (width) of pattern of the mask layer was confirmed with a critical dimension-scanning electron microscope, to be 57 nm.

The pattern of the mask layer was subjected to high-temperature etching. At that time, whether the pattern profile was maintained was confirmed. As an etching device, the following etching device owned by Nagoya University was used. The etching device includes a reaction chamber, a voltage applying portion, a partition, a gas chamber, a gas supply chamber, and the like, similarly to a general etching device. The etching device is a device for generating a capacitively coupled plasma (CCP). A stage in the reaction chamber in which a wafer having a film to be etched is disposed has a heating function, and is allowed to raise the temperature to 600° C. In etching, a mixed gas of $Cl_2$ and $N_2$ was used as a gas for etching, and the pressure was 20 Pa. The electric power at an upper portion was set to 200 W, and the bias electric power at a lower portion was set to 200 W. The etching time was 1 minute. The temperature of the heating stage was changed to 250, 300, 400, and 500° C. Changes in patterns before and after etching were confirmed by SEM. The results are shown in Table 2. The corresponding SEM photographs are shown in FIGS. 1 to 12.

TABLE 2

Pattern Profile before and after Etching

| | | |
|---|---|---|
| Example 1 | 250° C. | The pattern collapse, curve, and decrease of the film by 50 nm or more were not confirmed (FIG. 1) |

TABLE 2-continued

Pattern Profile before and after Etching

| | | |
|---|---|---|
| | 300° C. | The pattern collapse, curve, and decrease of the film by 50 nm or more were not confirmed (FIG. 2) |
| | 400° C. | The pattern collapse, curve, and decrease of the film by 50 nm or more were not confirmed (FIG. 3) |
| | 500° C. | The pattern collapse, curve, and decrease of the film by 50 nm or more were not confirmed (FIG. 4) |
| Example 2 | 250° C. | The pattern collapse, curve, and decrease of the film by 50 nm or more were not confirmed (FIG. 5) |
| | 300° C. | The pattern collapse, curve, and decrease of the film by 50 nm or more were not confirmed (FIG. 6) |
| | 400° C. | The pattern collapse, curve, and decrease of the film by 50 nm or more were not confirmed (FIG. 7) |
| | 500° C. | The pattern collapse, curve, and decrease of the film by 50 nm or more were not confirmed (FIG. 8) |
| Example 3 | 250° C. | The pattern collapse, curve, and decrease of the film by 50 nm or more were not confirmed (FIG. 9) |
| | 300° C. | The pattern collapse, curve, and decrease of the film by 50 nm or more were not confirmed (FIG. 10) |
| | 400° C. | The pattern collapse, curve, and decrease of the film by 50 nm or more were not confirmed (FIG. 11) |
| | 500° C. | The pattern collapse, curve, and decrease of the film by 50 nm or more were not confirmed (FIG. 12) |

(Mask Resistance of GaN to Etching)

A pattern profile after high-temperature etching of GaN was confirmed. The solution of the mask-forming composition adjusted in Example 2 was first applied to a wafer having a film of GaN using a spin coater. The wafer was baked on a hot plate at 240° C. for 1 minute and at 450° C. for 1 minute to form a mask layer (thickness: 300 nm). A silicon hard mask-forming composition solution corresponding to Example 15 of International Publication No. 2009/104552 pamphlet was applied to the mask layer, and baked at 240° C. for 1 minute, to form a silicon hard mask layer (thickness: 35 nm). A resist solution was applied to the silicon hard mask layer, and baked at 90° C. for 90 seconds, to form a resist layer (thickness: 1,100 nm). The resist layer was exposed to light by an i-line aligner, and subjected to post exposure bake (PEB) (at 110° C. for 1 minute), followed by development with an NMD-3 solution. As a result, a resist pattern of lines and spaces with a plurality of pattern line widths of 1 to 10 μm was obtained. The pattern size of one of the pattern line widths was confirmed to be about 7 μm. Subsequently, dry etching with a fluorine-based gas (component: $CF_4$) was carried out to transfer the resist pattern to the hard mask. Dry etching with an oxygen-based gas (component: $O_2$) was carried out to transfer the hard mask pattern to the mask layer.

Figure 13:
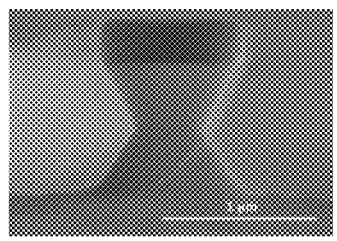
FIG. 13 is a SEM photograph of a pattern profile of a wafer having a GaN film having the mask layer formed from the composition of Example 2 after etching at 500° C.

The pattern of the mask layer was subjected to high-temperature etching. At that time, whether the pattern profile was maintained was confirmed. As an etching device, the following etching device owned by Nagoya University was used. The etching device includes a reaction chamber, a voltage applying portion, a partition, a gas chamber, a gas supply chamber, and the like, similarly to a general etching device. The etching device is a device for generating an inductively coupled plasma (ICP). A stage in the reaction chamber in which a wafer having a film to be etched is disposed has a heating function, and is allowed to raise the temperature to 600° C. In etching, a $Cl_2$ gas was used as a gas for etching, and the pressure was 20 Pa. The electric power at an upper portion was set to 400 W, and the bias electric power at a lower portion was set to 15 W. The etching time was 6 minutes. The temperature of the heating stage was set to 500° C. A change in pattern before and after etching was confirmed by SEM. The obtained SEM photograph is shown in FIG. 13. Even after etching GaN, a film sufficiently remained in the mask layer that was an upper layer. This shows that the mask layer is useful as an etching mask.

As confirmed from the results, in Examples 1 to 3, the pattern profile can be maintained under etching at high temperature. This shows that the mask layer has a function of serving as an etching mask even at high temperature and is useful for the process.

The invention claimed is:

1. A method for manufacturing a semiconductor substrate having a patterned group-III nitride compound layer, comprising:
    forming a patterned mask layer on a group-III nitride compound layer of the substrate, comprising forming a mask layer on the group-III nitride compound layer from a mask-forming composition by a spin coating method, forming an organic film on the mask layer, forming an organic pattern from the organic film by lithography, and patterning the mask layer, and
    etching the group-III nitride compound layer by dry etching at 300° C. or higher and 700° C. or lower using the patterned mask layer, to form a patterned group-III nitride compound layer,
    wherein the patterned mask layer contains a polymer containing a unit structure of the following Formula (1):

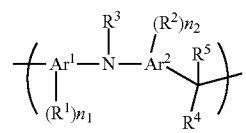

Formula (1)

wherein
Ar¹ and Ar² are each a benzene ring or a naphthalene ring,
R¹ and R² are each a substituent of a hydrogen atom on the benzene ring or naphthalene ring and are each selected from the group consisting of a halogen group, a nitro group, an amino group, a hydroxy group, a $C_{1-10}$ alkyl group, a $C_{2-10}$ alkenyl group, a $C_{6-40}$ aryl group, and a combination thereof, wherein the alkyl group, the alkenyl group, and the aryl group are an organic group optionally including an ether bond, a ketone bond, or an ester bond, $R^3$ is selected from the group consisting of a hydrogen atom, a $C_{1-10}$ alkyl group, a $C_{2-10}$ alkenyl group, a $C_{6-40}$ aryl group, and a combination thereof, the alkyl group, wherein the alkenyl group, and the aryl group are an organic group optionally including an ether bond, a ketone bond, or an ester bond, $R^4$ is a pyrenyl group, $R^5$ is selected from the group consisting of a hydrogen atom, a $C_{1-10}$ alkyl group, a $C_{6-40}$ aryl group, and a heterocyclic group, wherein the alkyl group, the aryl group, and the heterocyclic group are an organic group optionally substituted with a halogen group, a nitro group, an amino group, or a hydroxy group, $R^4$ and $R^5$ optionally form a ring together with a carbon atom to which $R^4$ and $R^5$ are bonded, and $n_1$ and $n_2$ are each an integer of 0 to 3, a polymer containing a unit structure of the following Formula (2):

  Formula (2)

Formula (2)

wherein $Ar_1$ is an organic group containing a $C_{6-50}$ arylene group or a heterocyclic group, a polymer containing a structural unit of the following Formula (3):

  Formula (3)

wherein $Ar_2$, $Ar_3$, and $Ar_4$ are an organic group containing a $C_{6-50}$ arylene group or a heterocyclic group, and T is a carbonyl group or a sulfonyl group, a polymer containing a combination of the unit structure of Formula (2) and the unit structure of Formula (3), or a crosslinked structure of any of the foregoing polymers.

2. The method according to claim 1, wherein the patterning the mask layer is done through the organic pattern.

3. The method according to claim 1, wherein the organic film is a resist film, and the forming of the organic pattern by lithography comprises irradiating the resist film with light or an electron beam followed by development to form the organic pattern as a resist pattern.

4. The method according to claim 1, wherein the patterned mask layer is further formed by forming a hard mask on the mask layer, forming the organic film on the hard mask, forming the organic pattern from the organic film by lithography, patterning the hard mask through the organic pattern, and patterning the mask layer through the patterned hard mask.

5. The method according to claim 1, wherein the mask-forming composition contains a crosslinker.

6. The method according to claim 1, wherein the mask-forming composition contains an acid and/or an acid generator.

7. A method for manufacturing a compound semiconductor device having a group-III nitride compound layer comprising a step of processing a semiconductor substrate obtained by the method according to claim 1.

* * * * *